(12) United States Patent
Shimada (10) Patent No.: US 8,304,773 B2
(45) Date of Patent: Nov. 6, 2012

(54) OXIDE SEMICONDUCTOR THIN-FILM TRANSISTOR

(75) Inventor: Mikio Shimada, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 268 days.

(21) Appl. No.: 12/679,667

(22) PCT Filed: Nov. 27, 2008

(86) PCT No.: PCT/JP2008/071990
§ 371 (c)(1),
(2), (4) Date: Mar. 23, 2010

(87) PCT Pub. No.: WO2009/072533
PCT Pub. Date: Jun. 11, 2009

(65) Prior Publication Data
US 2010/0200857 A1   Aug. 12, 2010

(30) Foreign Application Priority Data
Dec. 4, 2007   (JP) .................... 2007-313578

(51) Int. Cl.
*H01L 29/786* (2006.01)
(52) U.S. Cl. .................... 257/59; 257/E29.277
(58) Field of Classification Search .............. None
See application file for complete search history.

(56) References Cited

U.S. PATENT DOCUMENTS

| | | | |
|---|---|---|---|
| 7,145,174 B2 | 12/2006 | Chiang et al. | |
| 7,189,992 B2 | 3/2007 | Wager, III et al. | |
| 7,242,039 B2 | 7/2007 | Hoffman et al. | |
| 7,282,782 B2 | 10/2007 | Hoffman et al. | |
| 7,297,977 B2 | 11/2007 | Hoffman et al. | |
| 7,576,394 B2 | 8/2009 | Furuta et al. | |
| 7,601,984 B2 | 10/2009 | Sano et al. | |
| 7,674,650 B2 | 3/2010 | Akimoto et al. | |
| 8,158,975 B2 * | 4/2012 | Akimoto | 257/43 |
| 2006/0108636 A1 | 5/2006 | Sano | |
| 2006/0244107 A1 * | 11/2006 | Sugihara et al. | 257/646 |
| 2007/0187760 A1 | 8/2007 | Furuta | |
| 2008/0258140 A1 * | 10/2008 | Lee et al. | 257/43 |
| 2009/0162750 A1 | 6/2009 | Kawakami et al. | |
| 2009/0294765 A1 * | 12/2009 | Tanaka et al. | 257/43 |
| 2010/0193782 A1 * | 8/2010 | Sakata | 257/43 |
| 2011/0240998 A1 * | 10/2011 | Morosawa et al. | 257/57 |

FOREIGN PATENT DOCUMENTS

JP   2-189935 A   7/1990

(Continued)

OTHER PUBLICATIONS

Korean Office Action dated Aug. 30, 2011 issued during prosecution of related Korean application No. 10-2010-7014372.

(Continued)

*Primary Examiner* — Benjamin Sandvik
(74) *Attorney, Agent, or Firm* — Fitzpatrick, Cella, Harper & Scinto (57) ABSTRACT

A transistor includes a gate electrode, a gate insulating layer, a semiconductor layer including an amorphous oxide, source-drain electrodes, and a protective layer on a substrate. The semiconductor layer includes a first region corresponding to a region in which the source-drain electrodes are formed, and a second region not corresponding to the region in which the source-drain electrodes are formed. At least the first region includes a crystalline component having a composition different from the composition of the amorphous oxide in the second region.

12 Claims, 5 Drawing Sheets

FOREIGN PATENT DOCUMENTS

| | | |
|---|---|---|
| JP | 11-191629 A | 7/1999 |
| JP | 2006-58676 A | 3/2006 |
| WO | 2006/051993 A2 | 5/2006 |

OTHER PUBLICATIONS

Chinese Office Action dated May 20, 2011 issued during prosecution of related Chinese application No. 200880118787.4 (whole English-language translation included).

PCT International Search Report and Written Opinion of the International Searching Authority, International Application No. PCT/JP2008/071990, Mailing Date Feb. 18, 2009.

Fortunato, et al., "Wide-bandgap high-mobility ZnO thin-film transistors produced at room temperature", Applied Physics Letters, vol. 85, No. 13, Sep. 27, 2004, pp. 2541-2543.

Taiwanese Office Action dated Apr. 10, 2012 in Taiwanese Application No. 097145742.

\* cited by examiner

ELECTRON DIFFRACTION PATTERN
(MICRODIFFRACTION)

FIG. 5B

METAL In: DIFFRACTION PATTERN OF
[010] INCIDENCE

OXIDE SEMICONDUCTOR THIN-FILM TRANSISTOR

TECHNICAL FIELD

The present invention relates to an oxide semiconductor device, and specifically relates to a thin-film transistor (TFT) using an amorphous oxide semiconductor.

BACKGROUND ART

In recent years, the development of TFTs using a transparent oxide semiconductor for an active layer is in progress.

U.S. Patent Application Publication No. US-2006-108636 A1 discloses a TFT technique using an amorphous transparent oxide semiconductor film (IGZO film), which includes In, Ga, Zn and O, as an active layer. The TFT, which is transparent and can be formed at a low temperature, is drawing attention because the TFT enables formation of a transparent TFT on a flexible substrate of, e.g., plastic.

Figure 2:
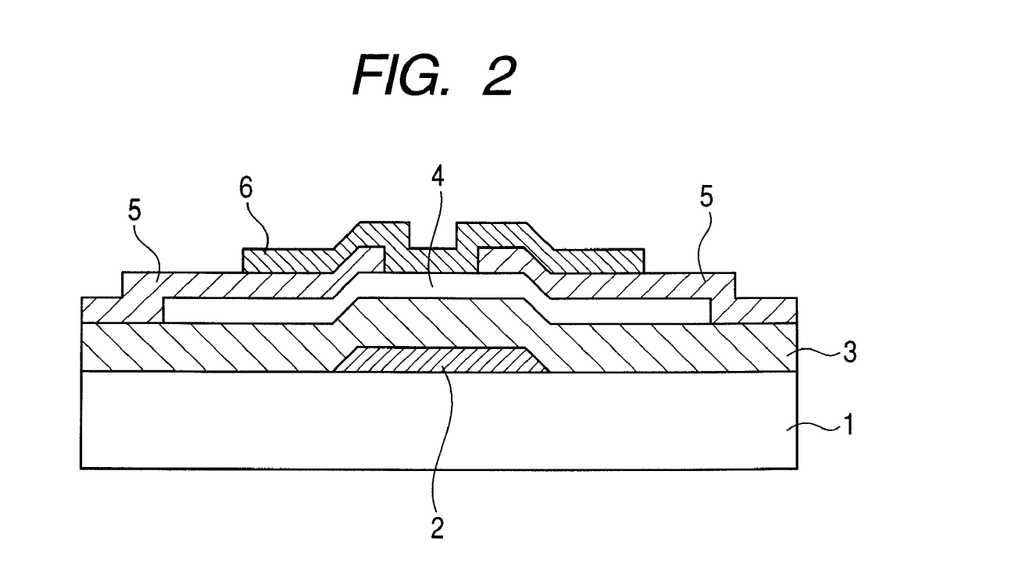
FIG. 2 is a cross-sectional view of a typical bottom gate-type TFT.

FIG. 2 illustrates the structure of a typical bottom gate-type TFT using an oxide semiconductor. The typical bottom gate-type TFT is formed by depositing a gate electrode 2, a gate insulating layer 3, a semiconductor layer 4, source-drain electrodes 5 and a protective layer 6 on a substrate 1.

Upon a voltage being applied to the gate electrode, a channel is formed in a part of the semiconductor region at the inner portion of the semiconductor layer located above the gate electrode. However, no channel is formed in the majority of the semiconductor region located below the source-drain electrodes, where serves as a sort of resistor (which is also referred to as "parasitic resistance"). Accordingly, in order to enhance the current drive capability, it is necessary to lower the resistance of the semiconductor layer below the source-drain electrodes to provide improved electrical matching between the region where the source-drain electrodes are formed and the corresponding semiconductor region.

An object of the present invention is to provide an oxide semiconductor TFT that provides excellent electrical matching between a source-drain electrode and a semiconductor layer.

DISCLOSURE OF THE INVENTION

In order to achieve the above object, paying attention to the semiconductor region below the source-drain electrodes in a bottom gate-type TFT, the present inventors have studied the correlation between the semiconductor region and the properties from the perspective of morphological observation and analysis using an electron microscope, and found a configuration providing a low resistance.

The present invention has been completed as a result of the present inventors' diligent study based on the above knowledge, and the essential feature of the present invention provides a transistor including a gate electrode, a gate insulating layer, a semiconductor layer including an amorphous oxide, source-drain electrodes, and a protective layer, characterized in that: the semiconductor layer comprises a first region corresponding to a region in which the source-drain electrodes are formed, and a second region not corresponding to the region in which the source-drain electrodes are formed; and at least the first region includes a crystalline component having a composition different from the composition of the amorphous oxide in the second region.

The TFT according to the present invention can be used to lower the resistance of the semiconductor layer immediately below the source-drain electrodes, whereby the parasitic resistance can be reduced and improved electrical matching can be provided between the source-drain electrodes and the corresponding semiconductor region by.

Further feature of the present invention will become apparent from the following description of exemplary embodiments with reference to the attached drawings.

BEST MODES FOR CARRYING OUT THE INVENTION

Hereinafter, the configuration of a bottom gate-type TFT according to the present invention will be described with reference to FIG. 1.

Figure 1:
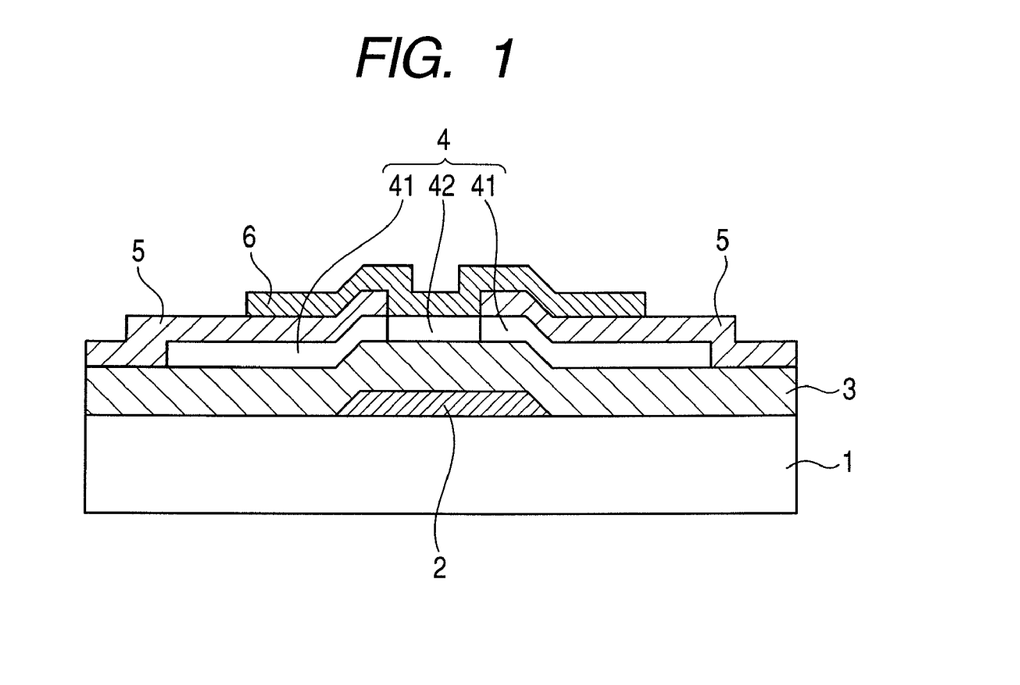
FIG. 1 is a cross-sectional view of a bottom gate-type TFT with crystal grains contained in a semiconductor layer, according to the present invention.

The bottom gate-type TFT according to the present invention, as shown in the cross-sectional view in FIG. 1, is formed by depositing a gate electrode 2, a gate insulating layer 3, a semiconductor layer 4, source-drain electrodes 5 and a protective layer 6 on a substrate 1. The semiconductor layer 4 includes a first region 41 corresponding to the source-drain electrodes 5 and a second region 42 not corresponding to the source-drain electrodes.

In the present invention, "a region corresponding to (or not corresponding to) a region in which electrodes are formed" refers to a region in contact with (or not in contact with) electrodes formed on a semiconductor layer, and a region of the semiconductor layer extending in the layer-thickness direction from that region, i.e., the whole semiconductor region existing below (immediately below) the region in which the electrodes are formed.

A glass plate is used for the substrate 1. A plastic film of, e.g., polyethylene terephthalate (PET) or polyethylene naphthalate (PEN), can also be used for the substrate 1.

The gate electrode 2 is deposited on the substrate 1. For the gate electrode 2, metals, such as Ti, Mo, W, Al, Au, etc., can be used. For the metals, not only a single substance but also an alloy, such as Mo—W, for example, can be used. Also, in order to increase the adhesion of the film, a metal exhibiting good adhesion to an oxide, e.g., a laminate of metals formed by sandwiching Al or Au by Ti, can be used as the electrode.

The gate insulating layer 3 is formed above the substrate 1 and the gate electrode 2. For the gate insulating layer 3, Si oxides and Si nitrides such as $SiO_x$, SiN, SiON, etc., are used. Also, an oxide and nitride of not only Si but also another metal element, e.g., $Al_2O_3$ or AlN can be used.

The semiconductor layer 4 is deposited on the gate insulating layer 3. For the semiconductor layer 4, an oxide semiconductor containing at least one of In, Sn, Ga and Zn is used. The configuration of the semiconductor layer 4 will be described later.

The source-drain electrodes 5 are deposited on the semiconductor layer 4. For the source-drain electrodes 5, metals, such as the metals used in the gate electrode 2, can be used. Also, for the metals, as with the gate electrode 2, not only a single substance but also an alloy, such as Mo—W, can be used. Furthermore, for enhancement of mechanical adhesion and electrical contact to an oxide semiconductor, e.g., a laminate of Ti and other metals, can be used. Any of the electrodes, when a laminate of metals is used for such electrode, the role as an electrode can be divided between a metal forming an interface with an adjacent layer, and a metal for transporting charge or applying voltage to the interface.

The protective layer 6 is deposited above the source-drain electrodes 5 and the semiconductor layer 4. For the protective layer 6, an insulating metal oxide, such as a silicon oxide or silicon nitride, or an insulating organic film is used.

(Regarding the Semiconductor Layer)

In one of the exemplary embodiments of the present invention, the first region 41 of the semiconductor layer contains crystalline components (typically, crystal grains) having compositions different from the composition of the amorphous oxide in the second region 42 of the semiconductor layer. In this case, the crystalline components have electric resistances lower than the electric resistance of the amorphous oxide. Consequently, the first region has a low resistance on an average of the entire region.

In the present invention, as the amount of the crystalline components becomes large, such crystalline components become observable via a transmission electron microscope (TEM) as crystal grains. However, even though the crystalline components are not observed via a TEM, the semiconductor layer is a semiconductor layer according to the present invention, which contains crystalline components if diffraction peaks caused by the crystalline components are observed by means of an analysis method such as an X-ray diffraction analysis.

Also, in one of the exemplary embodiments of the present invention, the crystalline components (typically, crystal grains) are metal crystals formed of the metal elements contained in the amorphous oxide. A metal crystal has a resistance much lower than the resistance of an oxide. Then, the proportion (also referred to the "content") of the metal per unit volume in the first region of the present invention is larger than the proportion of the metal per unit volume in the second region of the present invention. As a result, the first region has a low resistance on an average of the entire region, reducing the parasitic resistance, and providing improved electrical matching between the electrodes and the semiconductor layer.

The existence of the crystal grains can be confirmed by means of observation via a transmission electron microscope (TEM). The crystal grains in the amorphous can be discriminated as an image based on diffraction contrast.

The existence of the crystalline components (typically, crystal grains) can be confirmed by acquiring electron diffraction patterns. Furthermore, the crystal structures and/or materials can be identified.

Also, by means of composition analysis via a scanning TEM (STEM) and an energy dispersive X-ray spectroscopy (EDX), the metal composition of the crystal grains different from the metal composition of the matrix of the peripheral amorphous oxide can be confirmed.

The detailed mechanism for forming the crystal has not necessarily been clarified. However, according to the inventors' knowledge, the following two points can be considered as being related to the mechanism: (1) the metal in the source-drain electrodes disperses into the oxide semiconductor; and (2) heat is locally accumulated by an insulating layer which exhibits poor thermal conductivity. Crystallization can be considered to occur even at a low temperature as a result of a synergetic effect of these two points.

Accordingly, a method for forming the semiconductor layer 4 requires no special conditions for the sake of forming crystal grains (also referred to as fine crystals) in the first region 41 of the semiconductor layer corresponding to the region in which the source-drain electrodes are formed. However, it is desirable that the source-drain electrodes are formed at a high film-deposition rate by means of vapor deposition in order to locally provide an amount of heat.

A display device can be formed by connecting the source electrode or the drain electrode, which is an output terminal of the TFT, to an electrode of a light-emitting element or an optical switching element. Hereinafter, an example of the configuration of a specific display device will be described with reference to a cross-sectional diagram.

Figure 8:
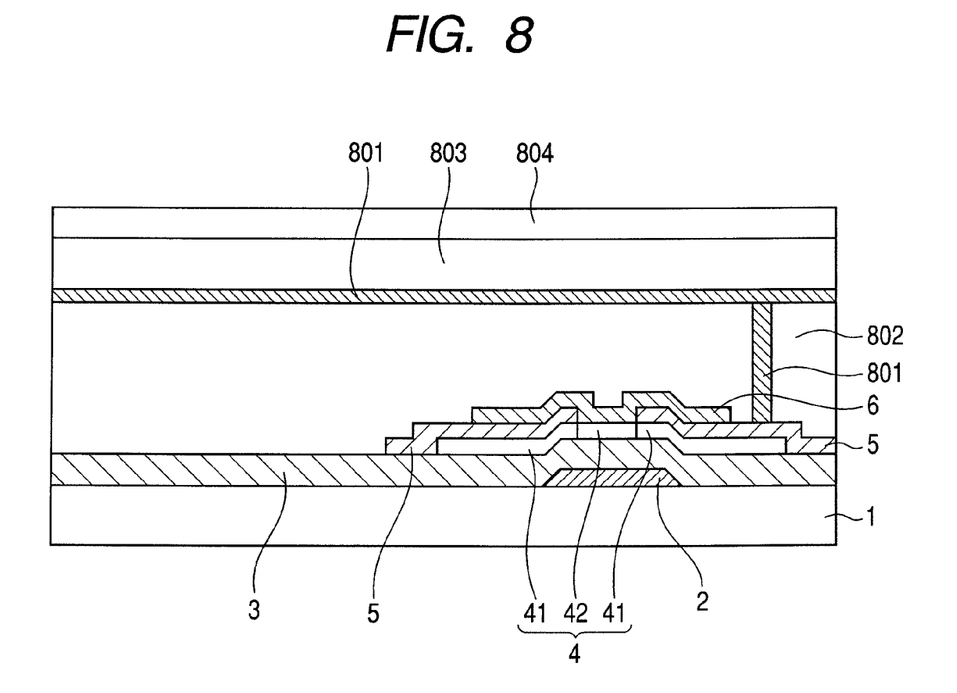
FIG. 8 is a cross-sectional view of an example of a display device as an embodiment of the present invention.

FIG. 8 is a cross-sectional view of an example of a display device using an organic EL element as a light-emitting element, as an embodiment of the present invention.

A TFT, which includes a gate electrode 2, a gate insulating layer 3, a semiconductor layer 4, source-drain electrodes 5 and a protective layer 6, is formed on a substrate 1.

A lower electrode 801 is connected to the source-drain electrodes 5 via an interlayer insulating film 802, the lower electrode 801 is in contact with a light-emitting layer 803, and the light-emitting layer 803 is in contact with an upper electrode 804. Here, the lower electrode 801, the light-emitting layer 803 and the upper electrode 804 forms an organic EL element.

The above-described configuration enables current applied to the light-emitting layer 803 to be controlled by the value of current flowing between the source-drain electrodes 5 via a channel formed in the semiconductor layer 4.

Accordingly, this organic EL element can efficiently be controlled by the voltage of the gate electrode 2 of the TFT, which has a small parasitic resistance.

Hereinafter, a further detailed description of the present invention will be given by means of examples; however, the present invention is not limited in any way by such examples.

EXAMPLES

Example 1

In this example, a TFT with metal crystals contained in a semiconductor layer will be described.

The bottom gate-type TFT shown in FIG. 1 is prepared using a glass substrate.

First, a multilayer metal film of Ti (5 nm)/Au (40 nm)/Ti (5 nm) is formed on a glass substrate by means of vapor deposition. The film-deposition rates at this time are 0.2 nm/sec for Ti and 1 nm/sec for Au. This metal film is patterned by means of photolithography to form a gate electrode.

A film of amorphous $SiO_x$ is formed in a thickness of 200 nm on the gate electrode by sputtering to form a gate insulating layer. The amorphous $SiO_x$ is formed with the substrate temperature kept at room temperature, using a RF sputtering apparatus. The RF power is 400 W. Ar is used for the sputtering gas at this time.

A film of an amorphous oxide semiconductor containing In—Zn—Ga—O is formed in a thickness of 40 nm on the gate insulating layer by means of sputtering. The amorphous semiconductor film is formed with the substrate temperature kept at room temperature, using a RF sputtering apparatus. The RF power is 200 W. The sputtering gas at this time is an oxygen/Ar gas with a mixture ratio of 5:95. This amorphous oxide semiconductor film is patterned by means of photolithography and wet etching to form a semiconductor layer.

Subsequently, a metal film of Ti (5 nm)/Au (100 nm)/Ti (5 nm) is formed by means of vapor deposition. The film-deposition rates at this time are 0.2 nm/sec for Ti, and 1 nm/sec for Au. This metal film is patterned by means of photolithography to form source-drain electrodes.

A film of amorphous $SiO_x$ is formed in a thickness of 100 nm on the source-drain electrodes by means of sputtering to form a protective layer. The film of amorphous $SiO_x$ is formed with the substrate temperature kept at room temperature, using a RF sputtering apparatus. The RF power is 400 W. The sputtering gas at this time is an oxygen/Ar gas with a mixture ratio of 50%, and the protective layer is formed in an oxidative atmosphere.

Consequently, the bottom gate-type TFT shown in FIG. 1 is completed.

(Crystal Grains in a Semiconductor Layer Below Source-Drain Electrodes)

Figure 3:
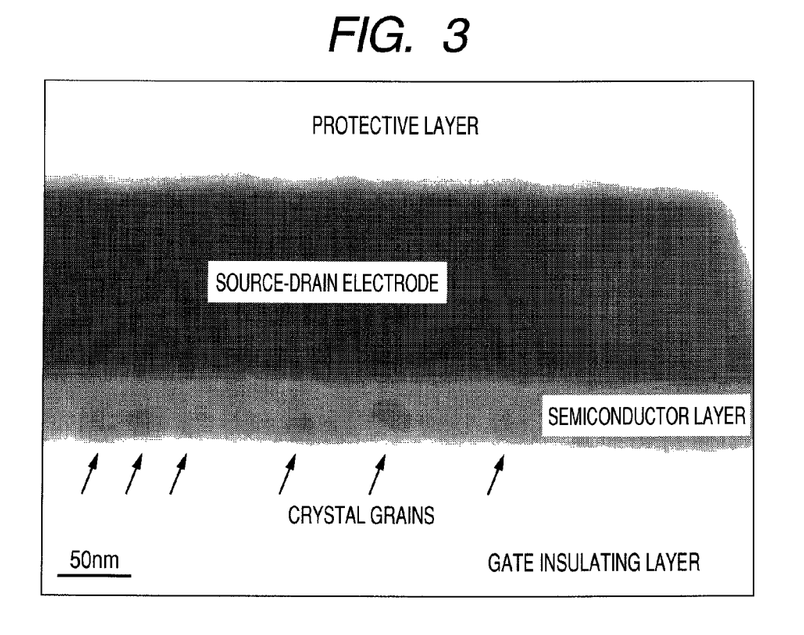
FIG. 3 is a cross-sectional TEM photograph showing crystal grains contained in a semiconductor layer immediately below source-drain electrodes in a TFT according to example 1.

A cross-sectional TEM photograph of a TFT, which has been prepared in such a manner as described above, is shown in FIG. 3. Here, in the TEM photograph, a gate insulating layer, a semiconductor layer, source-drain electrodes and a protective layer can be observed in sequence from the bottom. The existence of crystal grains with a diameter of around 20 nm in the semiconductor layer can be observed. Also, many of the crystal grains exist at the interface with $SiO_x$ forming the gate insulating layer. This can be considered to result from the interface functioning as a heterogeneous crystal nucleation site.

Figure 4:
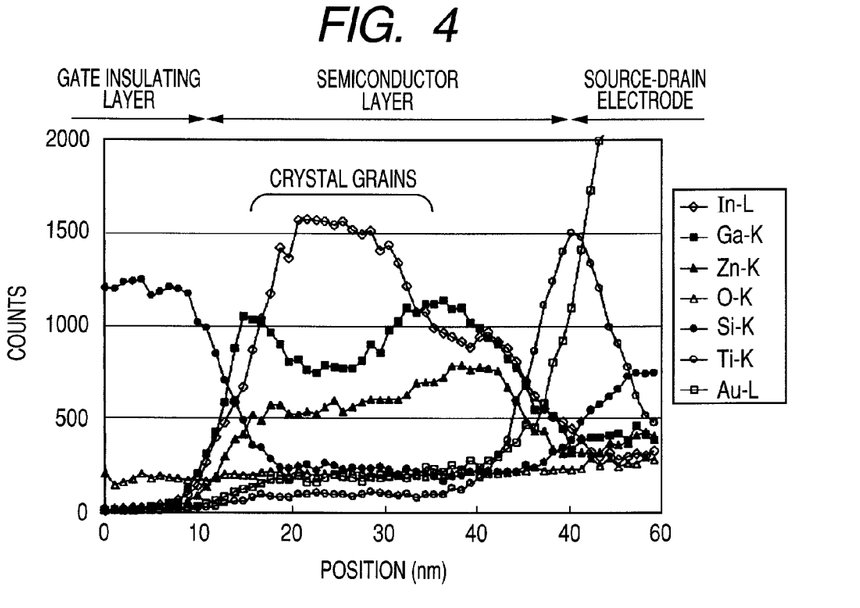
FIG. 4 is a characteristic X-ray intensity profile of crystal grains contained in a semiconductor layer subjected to line analysis by means of a STEM-EDX.

FIG. 4 shows a characteristic X-ray intensity profile in which one of the crystal grains formed in a TFT, which has been prepared in such a manner as described above, is subjected to line analysis by means of a STEM-EDX linear analysis. The region from the gate insulating layer to the semiconductor layer and the source-drain electrode is analyzed at measurement point intervals of approximately 1 nm. It can be seen that the crystal grain has an In-excess composition. As a result of similar measurements, existence of a crystal grain exhibiting a Ga-excess composition or Zn-excess composition has been confirmed.

Figure 5A:
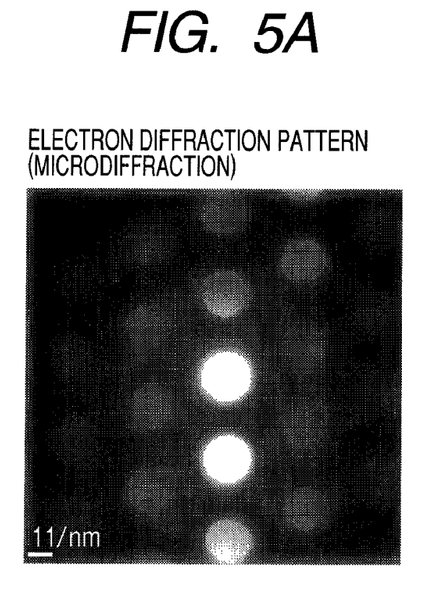
FIGS. 5A and 5B show an electron diffraction pattern obtained from crystal grains (experiment data), and a diffraction pattern calculated based on the assumption of incidence on [010] of a metal In, respectively.
Figure 5B:
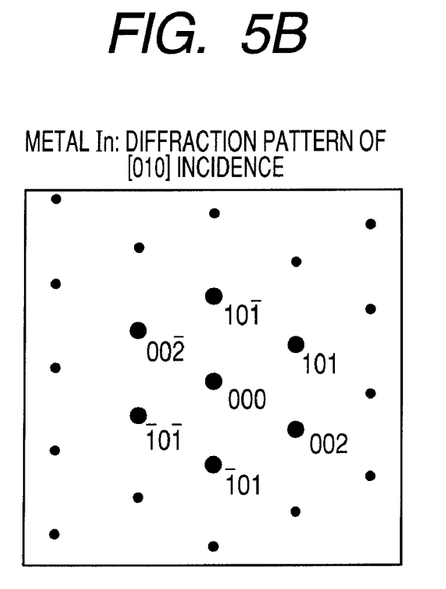

FIGS. 5A and 5B show an electron diffraction pattern (microdiffraction) obtained by applying an electron beam focusing on one of the crystal grains, and a diffraction pattern calculated based on the assumption of incidence on [010] of a metal In (space group: I4/mmm, and lattice constant: a=b=0.3252 nm, c=0.4946 nm), respectively. Although, since the electron beam is converged, diffraction spots spread in a disk-like form, it can be seen that the electron diffraction pattern well corresponds to the diffraction pattern of the [010] incidence. Also, the lattice spacing obtained from the obtained diffraction pattern well corresponds to that of the metal In.

Based on the aforementioned results, it has been confirmed that metal crystal grains are contained in the first region of the semiconductor layer, which is in contact with the source-drain electrodes.

It has been confirmed that although Ti/Au/Ti is used as the source-drain electrodes in this example, crystal grains exist in a similar manner even when only Au (film-deposition rate: 1 nm/sec, and film thickness: 100 nm) is used. Also, it has been confirmed that when only Ti (film-deposition rate: 0.2 nm/sec, and film thickness: 50 nm) is used, crystal grains exist but the crystal grains are formed at a low frequency. Accordingly, it can be considered that formation of crystal grains is not limited to being depending on metals in direct contact with the semiconductor layer, but on the amount of heat provided per unit time during electrode film-deposition.

(Lowering the Resistance of a Semiconductor Layer Below Source-Drain Electrodes)

In order to confirm lowering of the resistance of a semiconductor layer below source-drain electrodes, an element described below is prepared to measure electric conductivity.

Figure 6:
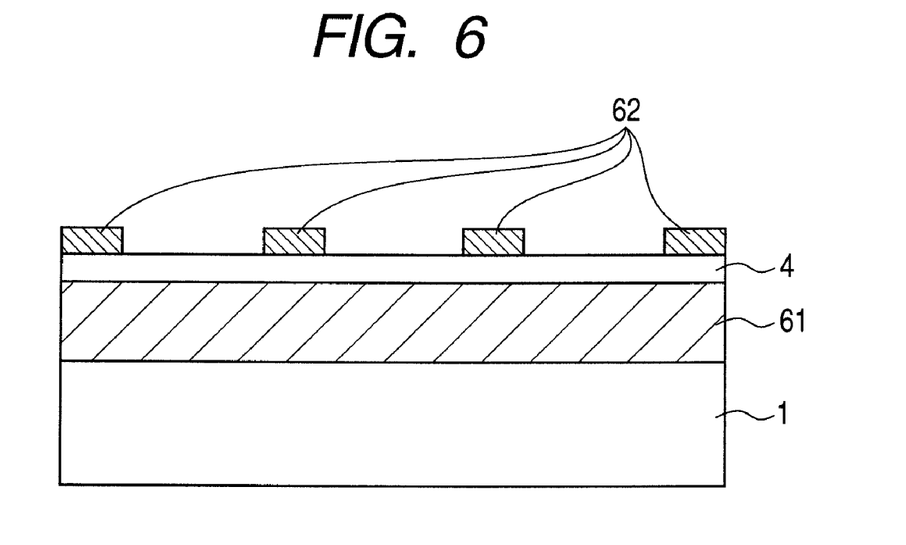
FIG. 6 is a cross-sectional view of a four-terminal measurement element for measuring the conductivity in an in-plane direction of a semiconductor layer.

FIG. 6 is a cross-sectional view of a four-terminal measurement element for measuring the conductivity in the in-plane direction of a semiconductor layer. An insulating layer 61 (amorphous $SiO_x$ with a thickness of 200 nm), and a semiconductor layer 4 (amorphous oxide semiconductor with a thickness of 20 nm, which contains In—Zn—Ga—O) are formed on a glass substrate 1 in sequence by means of sputtering. An electrode 62 for four-terminal measurement is further formed on the semiconductor layer by means of vapor deposition. Here, the electrode includes Au (40 nm)/Ti (5 nm), and Ti is in contact with the semiconductor layer.

The conditions for forming the respective layers are similar to those of example 1.

The electric conductivity in the in-plane direction of the semiconductor layer, that is, the electric conductivity of the semiconductor layer not located below the electrode, is approximately $10^{-5}$ S/cm.

Figure 7:
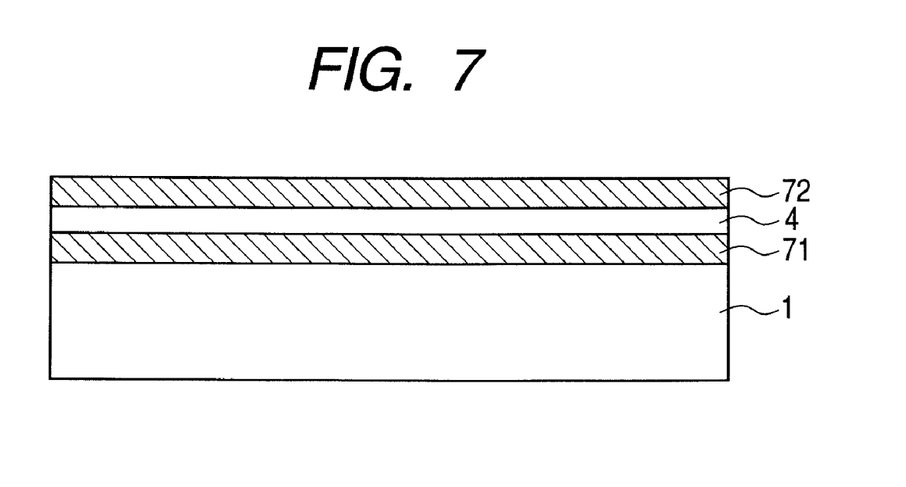
FIG. 7 is a cross-sectional view of an element for measuring the conductivity in a film-thickness direction of a semiconductor layer below an electrode.

FIG. 7 is a cross-sectional view of an element for measuring the electric conductivity in the film-thickness direction of the semiconductor layer below the electrode. A lower electrode 71 is formed on a glass substrate 1 by means of vapor deposition. A semiconductor layer 4 (amorphous oxide semiconductor containing In—Zn—Ga—O with a thickness of 20 nm) was formed on the lower electrode by sputtering. An upper electrode 72 is formed on the semiconductor layer by means of vapor deposition. Here, the lower electrode is formed of Ti (5 nm)/Au (40 nm)/Ti (5 nm). The upper electrode is formed of Au (40 nm)/Ti (5 nm), and Ti is in contact with the semiconductor layer.

The conditions for forming the respective layers are similar to those of example 1.

The electric conductivity in the film-thickness direction of the semiconductor layer, that is, the electric conductivity of the semiconductor layer located below the electrode, is approximately $10^{-1}$ S/cm.

Based on the aforementioned results, it can be confirmed that the semiconductor layer, which contains crystal grains, below the electrode has a significantly-low resistance.

As described above, according to the configuration of the present invention, as a result of including metal crystals, the semiconductor layer below the source-drain electrodes has a low resistance as a whole, enabling provision of an oxide semiconductor TFT with a reduced parasitic resistance.

Example 2

In this example, a display device using the TFT shown in FIG. 8 will be described.

The process for manufacturing the TFT is similar to that of example 1.

After the TFT is prepared, an interlayer insulation film is formed. At this time, a contact hole for connecting source-drain electrodes and a lower electrode is formed.

Next, a lower electrode is formed by forming a film of Al by means of vapor deposition. This lower electrode is connected to the drain electrode via the contact hole.

Next, an electron transport layer, a light-emitting layer, a hole transport layer and a hole injection layer are formed in sequence by means of vapor deposition to form an organic EL light-emitting layer as a whole.

Lastly, a film of ITO is formed by sputtering to form an upper electrode.

Here, upon applying a voltage to the source electrode of the TFT and changing the applied voltage of the gate electrode, current is charged into the light-emitting layer from the drain electrode via the lower electrode, enabling driving of the organic EL element.

As described above, a display device using an organic EL element that is driven by a TFT having a small parasitic resistance and providing excellent electrical matching between the electrodes and the semiconductor layer can be formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-313578, filed Dec. 4, 2007, which is hereby incorporated by reference herein in its entirety.

The invention claimed is:

1. A thin film transistor comprising a gate electrode, a gate insulating layer, a semiconductor layer, source-drain electrodes, and a protective layer,
   wherein the semiconductor layer comprises a first region and a second region,
   wherein the first region overlaps with the source-drain electrodes,
   wherein the second region does not overlap with the source-drain electrodes,
   wherein the first region comprises a metal crystal, and the second region comprises an amorphous oxide, and
   wherein the metal crystal contains a metal contained in the amorphous oxide.

2. The thin film transistor according to claim 1, wherein the amorphous oxide is an amorphous oxide semiconductor containing at least one of In, Sn, Zn and Ga.

3. A display device using the thin-film transistor according to claim 1.

4. The thin-film transistor according to claim 1, wherein a composition of the first region is different from a composition of the second region.

5. The thin-film transistor according to claim 1, wherein a proportion of a metal per unit volume in the first region is larger than a proportion of the metal per unit volume in the second region.

6. The thin-film transistor according to claim 1, wherein the second region functions as a channel region.

7. The thin-film transistor according to claim 1, wherein the first region is between the gate insulating layer and the source-drain electrodes.

8. The thin-film transistor according to claim 1, wherein the second region is provided over the gate electrode with the gate insulating layer interposed therebetween.

9. The thin-film transistor according to claim 1, wherein the protective layer is provided over the second region and the source-drain electrodes.

10. The thin-film transistor according to claim 1, wherein the metal crystal has an In-excess composition.

11. The thin-film transistor according to claim 1, wherein the metal crystal has a Ga-excess composition.

12. The thin-film transistor according to claim 1, wherein the metal crystal has a Zn-excess composition.

* * * * *